United States Patent
Xu et al.

(10) Patent No.: US 11,572,635 B2
(45) Date of Patent: Feb. 7, 2023

(54) CONTROLLED HOMO-EPITAXIAL GROWTH OF HYBRID PEROVSKITES

(71) Applicant: The Regents of the University of California, Oakland, CA (US)

(72) Inventors: Sheng Xu, La Jolla, CA (US); Yimu Chen, La Jolla, CA (US); Yusheng Lei, La Jolla, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 314 days.

(21) Appl. No.: 16/765,641

(22) PCT Filed: Nov. 20, 2018

(86) PCT No.: PCT/US2018/061924
§ 371 (c)(1),
(2) Date: May 20, 2020

(87) PCT Pub. No.: WO2019/100041
PCT Pub. Date: May 23, 2019

(65) Prior Publication Data
US 2020/0299861 A1    Sep. 24, 2020

Related U.S. Application Data

(60) Provisional application No. 62/588,721, filed on Nov. 20, 2017.

(51) Int. Cl.
*C30B 25/06* (2006.01)
*C30B 29/32* (2006.01)
(Continued)

(52) U.S. Cl.
CPC .............. *C30B 29/32* (2013.01); *C30B 25/06* (2013.01); *C30B 25/16* (2013.01); *C30B 25/18* (2013.01); *H01M 4/366* (2013.01)

(58) Field of Classification Search
CPC ......... C30B 29/32; C30B 25/06; C30B 25/16; C30B 25/18; H01M 4/366
See application file for complete search history.

(56) References Cited

U.S. PATENT DOCUMENTS

2015/0340632 A1    11/2015    Etgar

FOREIGN PATENT DOCUMENTS

| JP | 2014-056921 | * | 3/2014 |
| JP | 2014-056940 | * | 3/2014 |

(Continued)

OTHER PUBLICATIONS

Lei et al., "Controlled Homoepitaxial Growth of Hybrid Perovskites" Advanced Materials, Apr. 2, 2018.

*Primary Examiner* — Robert M Kunemund
(74) *Attorney, Agent, or Firm* — Stuart H. Mayer; Mayer & Williams PC

(57) ABSTRACT

Organic-inorganic hybrid perovskite has demonstrated tremendous potential for the next generation of electronic and optoelectronic devices due to their remarkable carrier dynamics. However, current studies of electronic and optoelectronic devices have been focused on polycrystalline materials, due to the challenges in synthesizing device compatible high quality single crystalline materials. Here, we firstly report the epitaxial growth of single crystal hybrid perovskites with controlled locations, morphologies, and orientations, using combined strategies of lithography, homoepitaxy, and low temperature solution method. The crystals grow following a layer-by-layer model under controlled growth parameters. The process is robust and can be readily scaled up. The as-grown epitaxial single crystals were integrated in an array of light emitting diodes, each crystal as a pixel with enhanced quantum efficiencies. This capability opens up new opportunities for designing and (Continued)

fabricating a diverse range of high performance electronic and optoelectronic devices using crystalline hybrid perovskites.

19 Claims, 16 Drawing Sheets

(51) Int. Cl.
*C30B 25/16* (2006.01)
*C30B 25/18* (2006.01)
*H01M 4/36* (2006.01)

(56) References Cited

FOREIGN PATENT DOCUMENTS

| JP | 2016-15777 A | 9/2016 |
| WO | 2016/123407 A1 | 8/2016 |

* cited by examiner

Fig. 2A
Fig. 2D
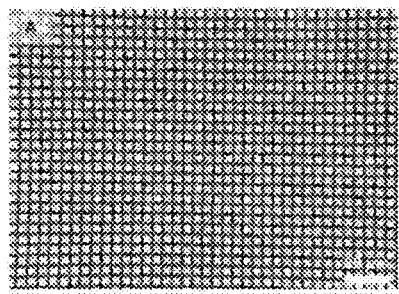
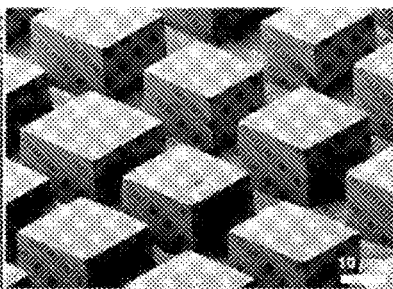
Fig. 2B
Fig. 2E
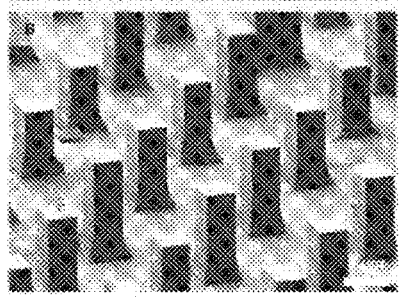
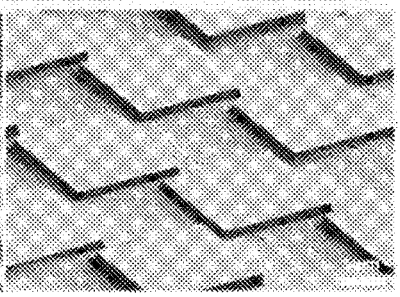
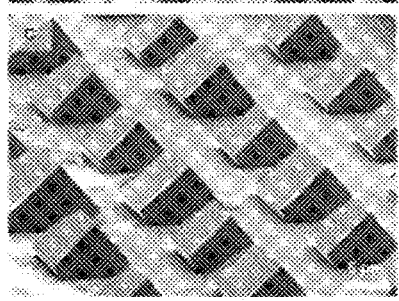
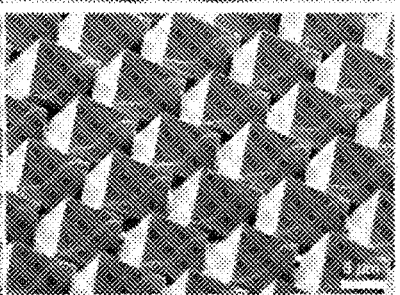
Fig. 2C
Fig. 2F Fig. 5A 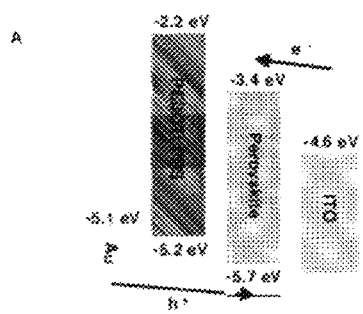 Fig. 5B 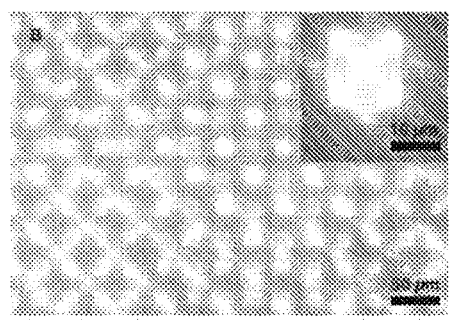
Fig. 5C 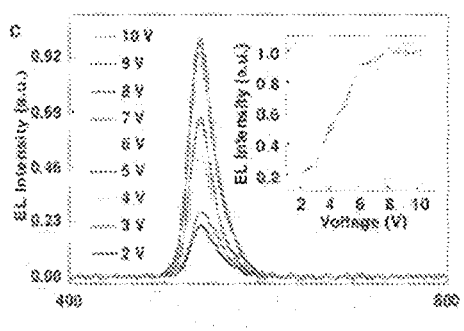 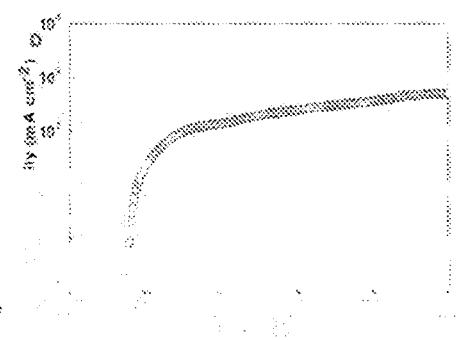 Fig. 5D
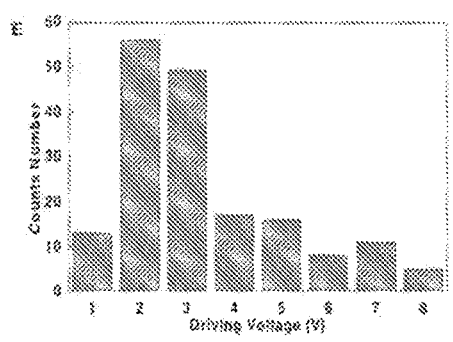 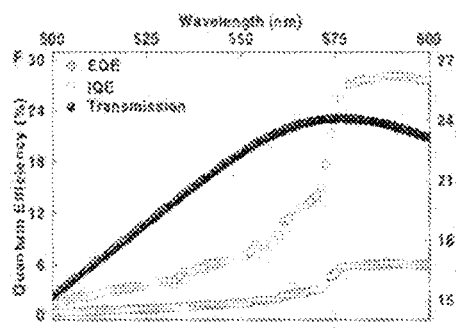
Fig. 5E  Fig. 5F

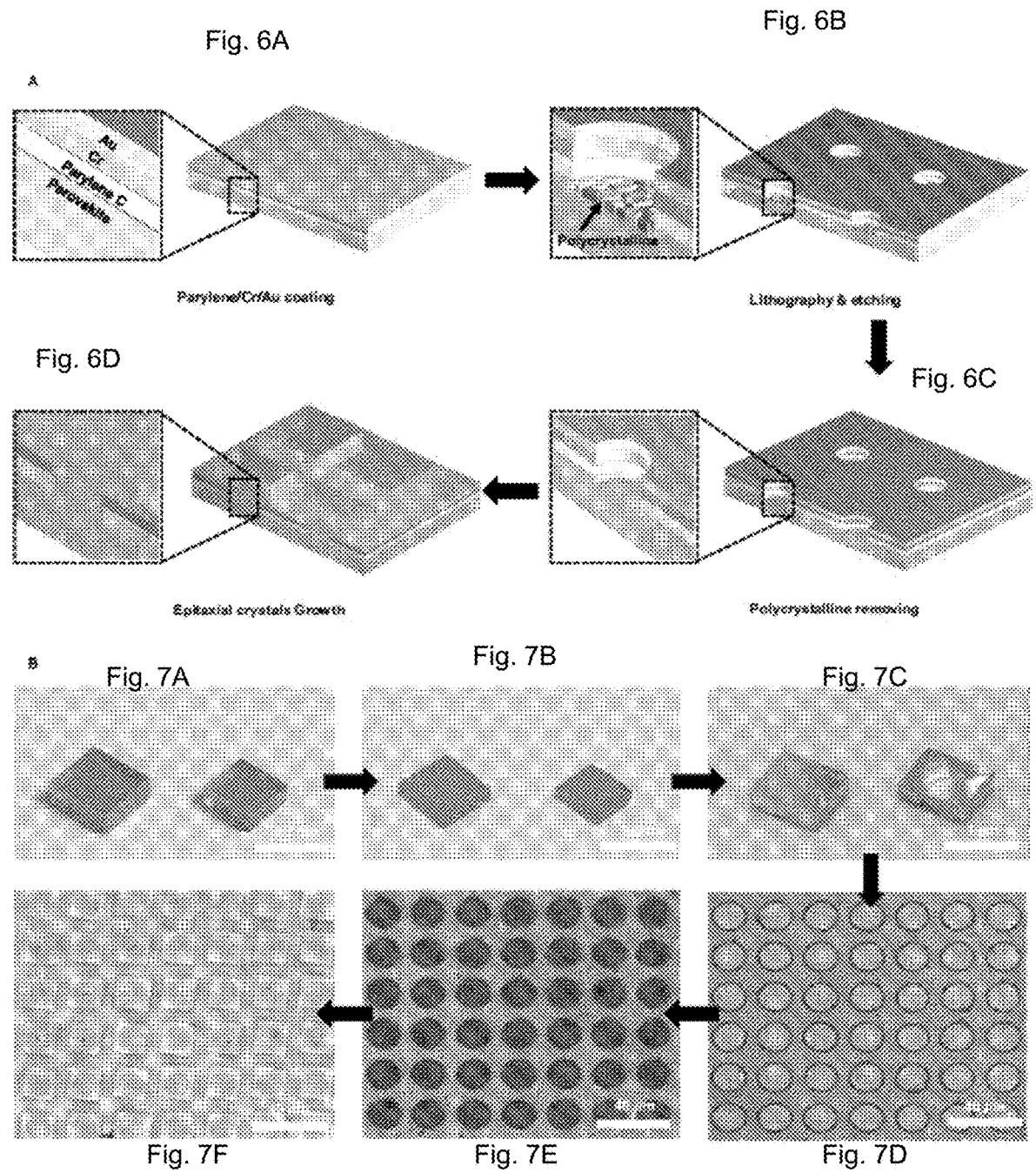

Fig. 9A
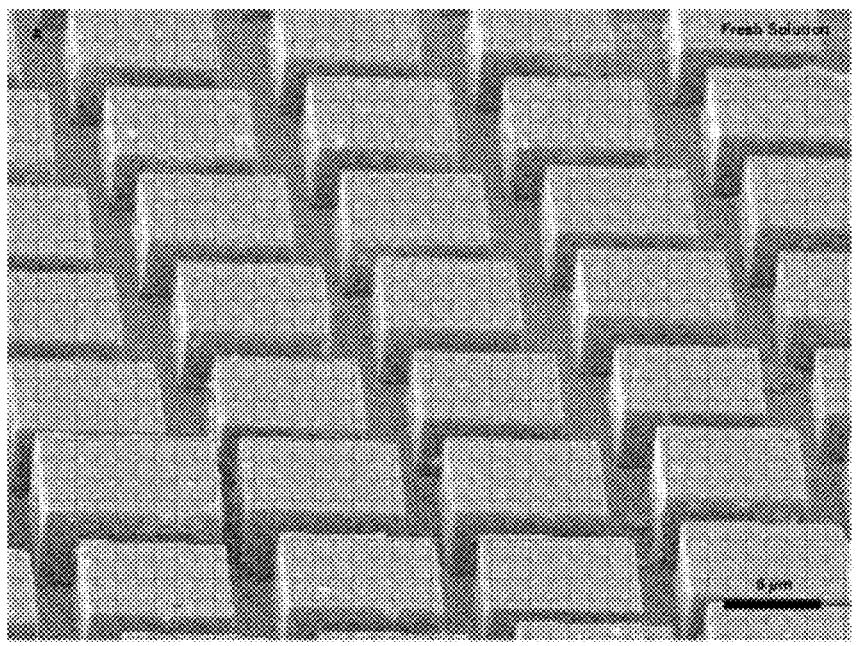
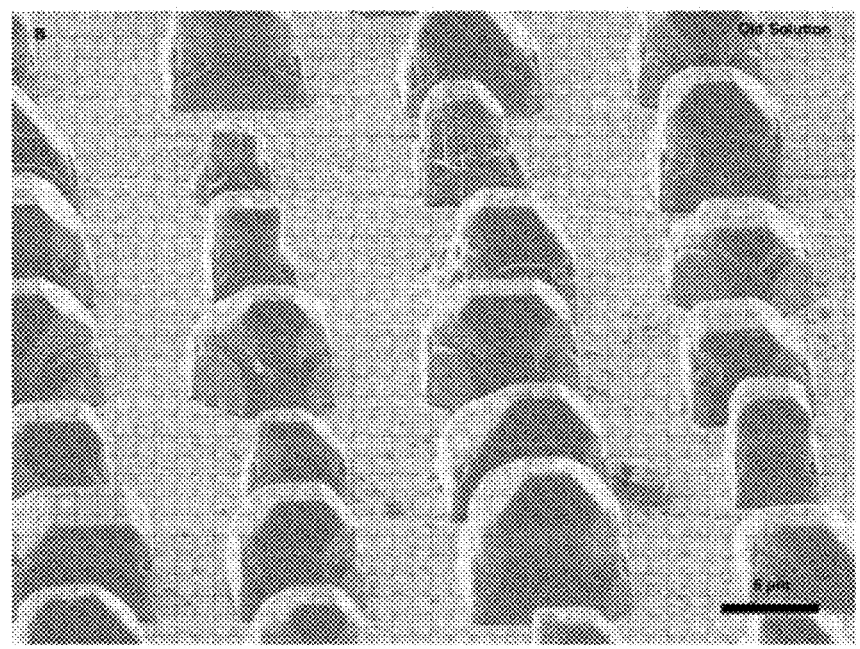
Fig. 9B

Fig. 11A
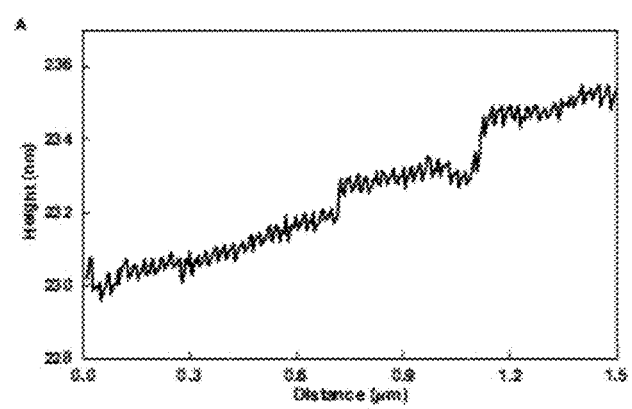
Fig. 11B
Fig. 11C
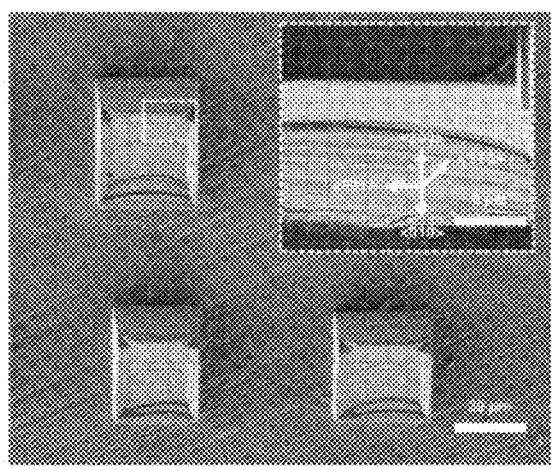
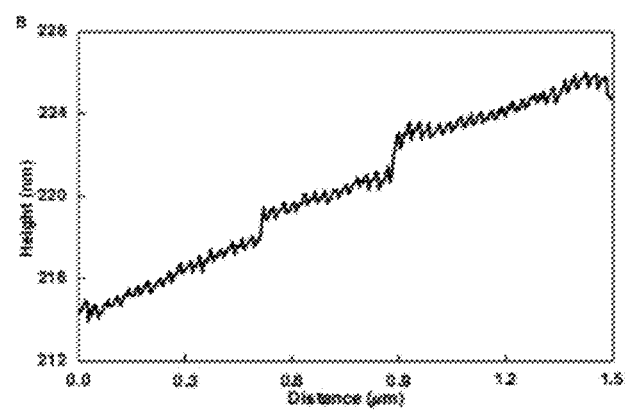
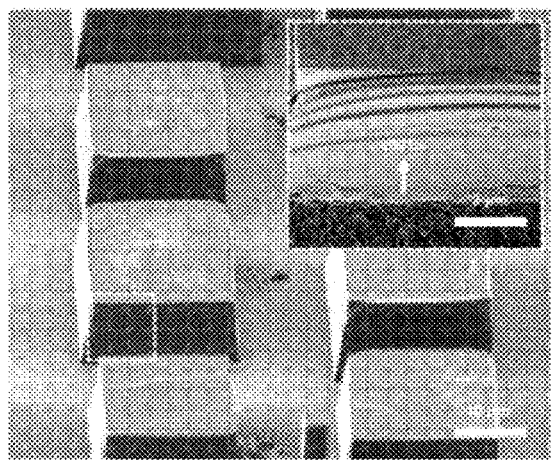
Fig. 11D

CONTROLLED HOMO-EPITAXIAL GROWTH OF HYBRID PEROVSKITES

CROSS-REFERENCE TO RELATED APPLICATIONS

This application claims benefit of priority of U.S. Provisional Patent Application Ser. No. 62/588,721, filed Nov. 20, 2017, entitled "CONTROLLED HOMO-EPITAXIAL GROWTH OF HYBRID PEROVSKITES", owned by the assignee of the present application and herein incorporated by reference in its entirety.

FIELD OF THE INVENTION

The invention relates to approaches for synthesizing epitaxial single crystalline hybrid perovskite arrays.

BACKGROUND

Organic-inorganic hybrid perovskites have demonstrated significant potential for next generation electronic and optoelectronic devices due to their remarkable carrier dynamics. However, current studies of electronic and optoelectronic devices have focused on polycrystalline materials, due to the challenges in synthesizing device compatible high quality single crystalline materials.

In more detail, organic-inorganic hybrid perovskite materials ($CH_3NH_3PbX_3$, X=Cl, Br, I) have attracted wide attention because of their properties such as low-temperature solution processability, tunable bandgap, and high carrier mobility. Due to these merits, organic-inorganic hybrid perovskite materials have been used in various types of optoelectronics devices including solar cells, photodetectors, lasers, and light emitting diodes (LEDs). However, current studies are focused on polycrystalline materials, which suffer from high defect concentration and therefore high free carrier recombination rate.

To improve device performance, various methods have been reported to improve the crystallinity of polycrystalline thin films such as thermal annealing, hot-casting, and solvent engineering. For example, the photo conversion efficiency was increased from 1% to 18% by increasing grain size from ~1 μm to ~180 μm. Different conversion strategies were demonstrated, but domain boundaries and defects were created during the crystal expansion or contraction processes. Van der Waals (VDW) epitaxial growth on mica was achieved, but the VDW force is much weaker than covalent bonds in conventional chemical epitaxy and does not allow robust growth in large scale.

Single crystal perovskite, with low levels of trap densities, grain boundaries and pinholes, can enhance the efficient transportation of charge carriers and minimize the nonradiative recombination. Centimeter-sized single crystals have been demonstrated with excellent optoelectronic properties. However, these materials have little controllability in their growth process and outcome, and their bulk size does not allow them to be integrated in electronic or optoelectronic devices that are typically based on thin films.

State-of-the-art approaches for integrating functional materials (e.g., Si and III-V materials) into devices such as epitaxial growth and microfabrication do not apply to hybrid perovskite materials, because of two significant challenges: the absence of a lattice matched substrate that allows its robust chemical epitaxial growth, and its vulnerability to trace amount of water that precludes it from using standard lithography-based microfabrication.

This Background is provided to introduce a brief context for the Summary and Detailed Description that follow. This Background is not intended to be an aid in determining the scope of the claimed subject matter nor be viewed as limiting the claimed subject matter to implementations that solve any or all of the disadvantages or problems presented above.

SUMMARY

Systems and methods according to present principles meet and overcome the problems noted above by synthesizing epitaxial single crystalline hybrid perovskite arrays, which allows their integration into high performance electronic and optoelectronic devices.

In more detail, disclosed are methods, materials, structures, articles of manufacture, devices, systems and applications that pertain to the epitaxial growth of single crystal hybrid perovskites with controlled locations, morphologies, and orientations. The same uses combined strategies of lithography, homoepitaxy, and low temperature solution methods. The crystals grow following a layer-by-layer model under controlled growth parameters. The process is robust and can be readily scaled up. The as-grown epitaxial single crystals may be integrated in various devices, including in an array of light emitting diodes, each crystal serving as a pixel with enhanced quantum efficiencies. This capability opens up new opportunities for designing and fabricating a diverse range of high performance electronic and optoelectronic devices using crystalline hybrid perovskites.

In one aspect, the invention is directed towards a method of preparing a heterostructure, including: providing a substrate layer, the substrate layer including an inorganic/organic hybrid perovskite; depositing on the substrate layer, a protective layer, the protective layer constituted of a material impervious to air, oxygen, water, and moisture; depositing on the protective layer an adhesion layer, the adhesion layer including an element selected from the group consisting of Cr, Ni, Ti, or elements with similar adhesive properties; depositing on the adhesion layer an electrode layer, the electrode layer including an element selected from the group consisting of Ag, Al, Au, Cu, or elements with similar electrical properties.

Implementations of the invention may include one or more of the following. The substrate layer may be a bulk crystal of MAPbBr3, and the protective layer may be a hermetic material such as Parylene-C, polyimide, epoxy, or another material that is a polymer and that is airtight, oxygen-tight, and water-tight, and which can be deposited as a thin film, or a combination of these. The protective layer may also be deposited by a step of vacuum phase physical vapor deposition (PVD), thermal evaporation, or other evaporation or sublimation processes. The adhesion layer may be deposited by a step of sputtering or other physical or chemical deposition technique. The electrode layer may be deposited by a step of sputtering or other physical or chemical deposition technique. The method may further include a step of patterning and lithography, which itself may include a step of dry etching. The method may further include epitaxially growing single crystalline hybrid perovskite crystals on top of the substrate layer subsequent to the dry etching step, and the epitaxially growing step may be performed by an inverse temperature method. The dry etching step may include a step of gas phase plasma etching. The method may further include controlling crystal morphology of the epitaxially grown single crystalline hybrid perovskite crystals by controlling crystal distribution, growth temperature, or growth time. The method may further include controlling crystal orientation of the epitaxially grown single crystalline hybrid perovskite crystals by controlling substrate orientation. The protective layer may be further configured to provide a degree of strain relief.

In another aspect, the invention is directed towards a heterostructure device, including: a substrate layer, the substrate layer including a bulk crystal of an inorganic/organic hybrid perovskite; a protective layer above the substrate layer, the protective layer constituted of a material impervious to air, oxygen, water, and moisture; an adhesion layer above the protective layer, the adhesion layer including an element selected from the group consisting of Cr, Ni, Ti, or elements with similar adhesive properties; an electrode layer above the adhesion layer, the electrode layer including an element selected from the group consisting of Ag, Al, Au, Cu, or elements with similar electrical properties; where at least a portion of the protective layer, adhesion layer, and electrode layer are patterned and photolithographed to expose at least a portion of the substrate layer; and an epitaxially-grown single crystalline perovskite layer above at least the exposed portion.

Implementations of the invention may include one or more of the following. The device may form part of an LED. The protective layer may be a hermetic material such as Parylene-C, polyimide, epoxy, or another material that is a polymer and that is airtight, oxygen-tight, and water-tight, and which can be deposited as a thin film, or a combination of these.

In another aspect, the invention is directed towards a device made by any of the above methods.

Future improvements include optimized hole and electron transportation layer design, as well as layer interface engineering. Further advantages of systems and methods according to present principles include the controllable growth of epitaxial perovskite single crystals with controllable distribution, morphology, and orientation. The homoepitaxy growth process follows a step-flow model in which the crystals are grown layer by layer when the deposition and diffusion rates are controlled in equilibrium. The enhanced electronic properties may be manifested by, e.g., single crystal LEDs arrays. Systems and methods described here provide the first patterned epitaxial growth of high-quality perovskite single crystals, which provides a critical advancement in involving organic-inorganic hybrid perovskite materials into microelectronics. This protocol can be advantageously transferred to other hybrid perovskites in the family and therefore open up exciting opportunities in the field.

Other advantages will be understood from the description that follows, including the figures and claims.

This Summary is provided to introduce a selection of concepts in a simplified form. The concepts are further described in the Detailed Description section. Elements or steps other than those described in this Summary are possible, and no element or step is necessarily required. This Summary is not intended to identify key features or essential features of the claimed subject matter, nor is it intended for use as an aid in determining the scope of the claimed subject matter. The claimed subject matter is not limited to implementations that solve any or all disadvantages noted in any part of this disclosure.

BRIEF DESCRIPTION OF THE DRAWINGS

FIGS. 2A-2F are scanning electron microscope (SEM) images of the controllable homo-epitaxial growth of organic-inorganic hybrid perovskites.

FIGS. 5A-5F illustrate a device demonstration of the controllable organic-inorganic hybrid perovskites.

FIGS. 6A-6D illustrate schematics and optical images of the growth process.

FIGS. 7A-7F illustrate schematics and optical images of the growth process.

FIGS. 9A and 9B illustrate how fresh saturated MAPbBr3 solution is necessary for the uniform epitaxial single crystal arrays growth.

FIGS. 11A-11D illustrate atomic-force microscopy (AFM) scan profiles of representative $MAPbBr_3$ epitaxial cubes with different growth directions, revealing the layer-by-layer growth mechanism.

Like reference numerals refer to like elements throughout. Elements are not necessarily to scale unless otherwise noted.

DETAILED DESCRIPTION

As noted above, systems and methods according to present principles have developed and employ patterned epitaxial growth of single crystal $CH_3NH_3PbBr_3$ ($MAPbBr_3$) with controllable crystal positions, morphologies, and orientations by using photolithography, homoepitaxy, and low-temperature solution growth.

Figure 1A:
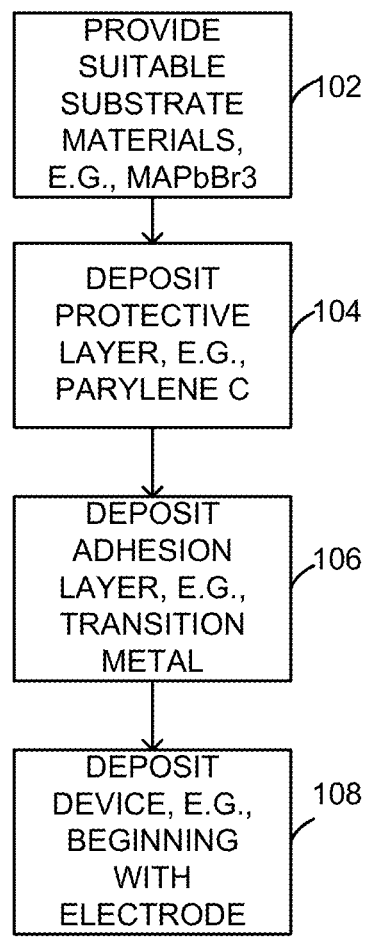
FIG. 1A illustrates a flowchart of growth.
Figure 1B:
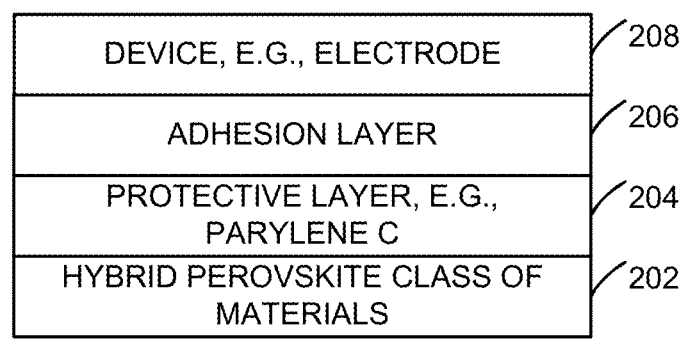
FIG. 1B illustrates a homo-epitaxial structure.

FIG. 1A illustrates a flowchart of growth, and FIG. 1B is an exemplary illustration of a homo-epitaxial structure.

The epitaxy crystals were found to grow by following a layer-by-layer model under precisely controlled growth conditions. The high-quality materials were manifested in, e.g., an array of LEDs, whose performance was significantly enhanced in comparison with their polycrystalline counterparts.

In more detail, in a first step 102, in order to achieve high quality epitaxial single crystal $MAPbBr_3$, a suitable substrate with similar lattice constants is required. See also layer 202 of FIG. 1B. That is, $MAPbBr_3$ itself becomes the best choice as a homoepitaxial substrate. Other suitable materials include other materials of the inorganic/organic hybrid perovskite class.

In a second step 104, on the bulk $MAPbBr_3$ perovskite crystal substrate, Parylene-C is sequentially deposited to protect it from aqueous developer and etchant. This protective layer may also be seen as layer 204 of FIG. 1B. An adhesion layer, e.g., Cr, may be deposited in step 106 (see also layer 206 in FIG. 1B). Finally, the device layer, beginning with an electrode such as Au, may be deposited in step 108. Layers 204, 206, and 208 may be sequentially deposited, and lithography may be employed, particularly via a dry etch, e.g., a gas phase plasma etch, to pattern these layers, e.g., via a dry etch, to achieve growth sites for epitaxial growth on top of the hybrid perovskite layer, as is described below in connection with FIG. 5 et seq.

Parylene-C may be replaced by any materials can effectively stop water or other aqueous solutions from contacting layer 202, e.g., other hermetic materials such as polyimide or epoxy, or any airtight, oxygen-tight, or watertight polymer which can be deposited as a thin film. This layer is crucial because hybrid perovskites can be damaged or destroyed by even a trace amount of moisture or water. This layer may also serve as a strain absorption material (see also FIG. 8 and accompanying discussion). And this layer may be deposited by vacuum phase physical vapor deposition (PVD), thermal evaporation, or other evaporation or sublimation processes.

Cr was the adhesion layer and Au was the electrode. Cr may be replaced by Ni, Ti, or other similar materials, and in this embodiment was deposited by sputtering, but other techniques may also be employed. This adhesion layer is very important, as without it, the above layers can delaminate very easily. Exemplary thicknesses of this adhesion layer may be, e.g., 30 nm to 200 nm.

Au serves as an electrode material, and may be replaced by Ag, Al, Cu, and in this embodiment was deposited by sputtering, but other techniques may also be employed. Exemplary thicknesses of this electrode layer may be, e.g., 80 nm to 200 nm.

This protocol was robust and reproducible and applies for general metallic and organic electrodes integration. After cleaning the interface in unsaturated $MAPbBr_3$ solution, the patterned perovskite substrates were placed in fresh saturated $MAPbBr_3$ solution (FIG. 9) to grow the crystals by the inverse temperature method, which is a known method for MAPbBr3 crystallization, under different temperature (from 30° C. to 200° C.) and time (from ~5 s to 24 hours).

FIG. 2 illustrates SEM images of the controllable homoepitaxial growth of organic-inorganic hybrid perovskites. More specifically, FIG. 2A is a top view of an array of epitaxial single crystals (left panel) and the corresponding tilted close-up view (FIG. 2D) shows their uniform size and cubic geometries. FIGS. 2B and 2E illustrate control of crystal morphology for rod-like (FIG. 2B) and plate-like (FIG. 2E) structures by controlling the crystal distribution, growth temperature, and growth time. FIGS. 2C and 2F illustrate crystal orientation control in <110> (FIG. 2C) and <111> (FIG. 2F) directions by using homoepitaxy substrates in different orientations. The crystals in A and B are all grown along<100>. All of the tilted images have a tilt angle of 60 degrees.

FIG. 2 thus indicates SEM images of the large-scale defect-free epitaxial single $MAPbBr_3$ cubes grown by the method according to present principles. All the cubes show uniform height and size. By controlling the growth temperature, growth time, and pattern geometry, epitaxial $MAPbBr_3$ with different morphologies can be achieved. Epitaxial single crystal rods and thin plates may be grown, which may be used to fabricate different electronic devices in follow up studies. Growth orientations can be controlled in <100> (FIGS. 2A and 2B), <110> (FIG. 2C), and <111> (FIG. 2F) directions by exploring different crystal planes of the $MAPbBr_3$ bulk crystal as the substrate. These orientations provide the platform of investigating the merit of different crystal planes in electronic transportation studies.

Figure 10:
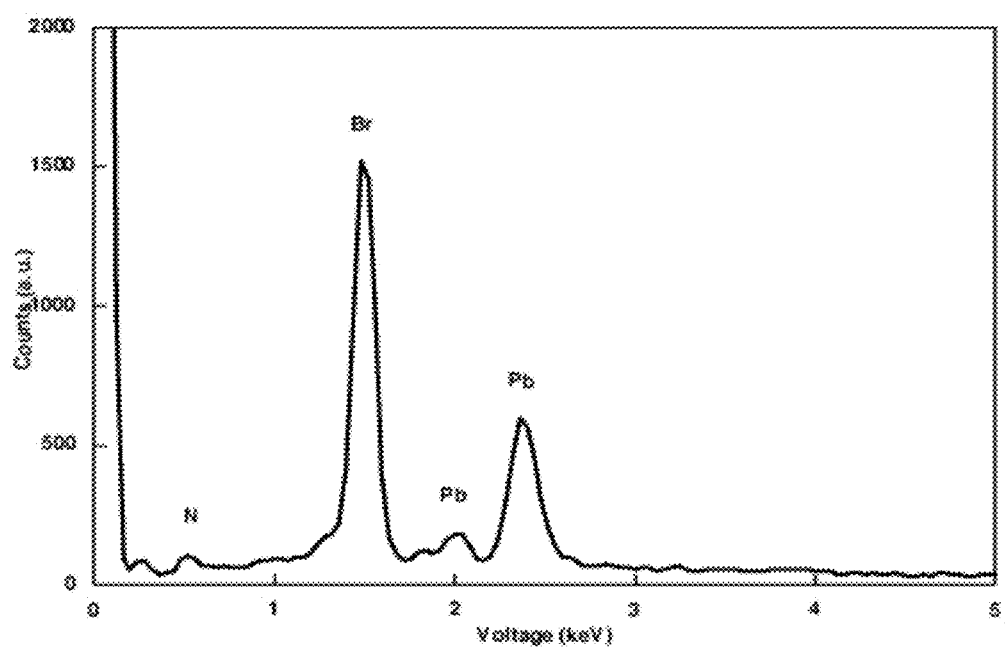
FIG. 10 illustrates energy-dispersive X-ray spectroscopy (EDX) spectroscopy of a MAPbBr3 epitaxial cube.

EDX element mapping of the epitaxial crystals is shown in FIG. 3 (and FIG. 10). That is, FIG. 3 illustrates structural and optical characterizations of grown structures.

Figure 3A:
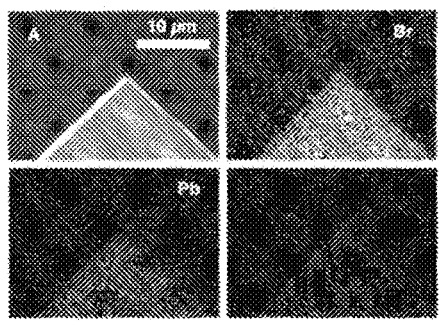
FIGS. 3A-3F illustrate structural and optical characterizations of the controllable organic-inorganic hybrid perovskites.
Figure 3B:
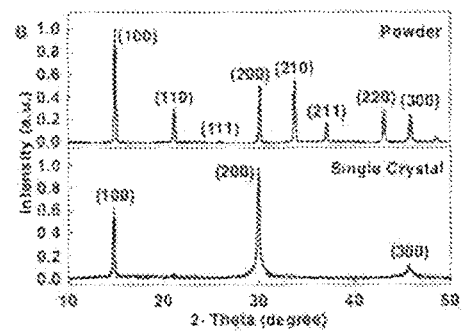
Figure 3C:
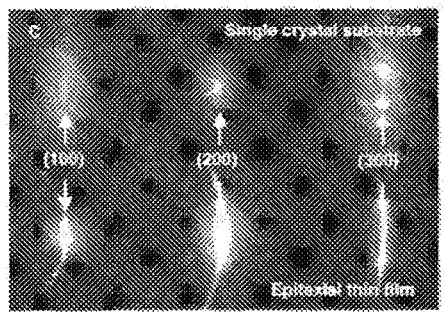
Figure 3D:
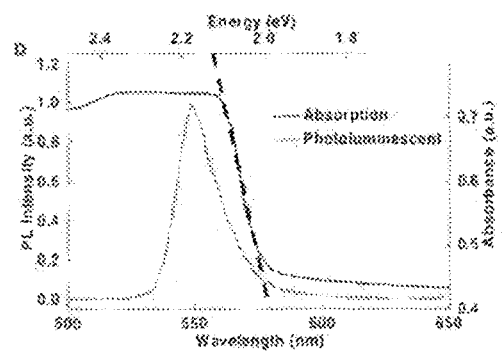
Figure 3E:
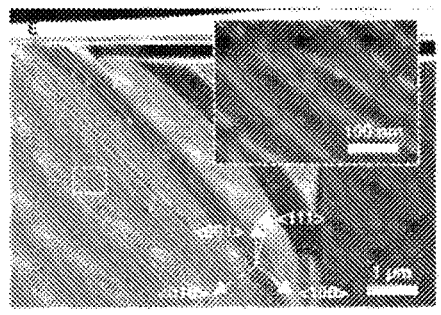
Figure 3F:
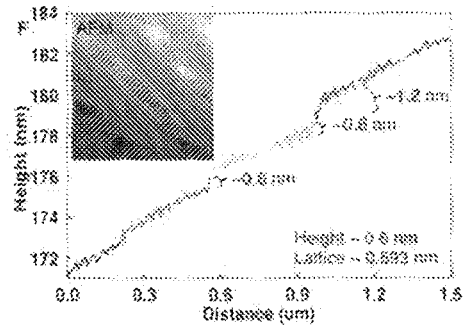

FIG. 3A illustrates EDX mapping for a typical epitaxial single crystal. FIG. 3B illustrates a powder x-ray diffraction (XRD) pattern for the $MAPbBr_3$ epitaxial thin film. FIG. 3C illustrates two-dimensional x-ray diffraction (2D-XRD) for bulk perovskite substrate and epitaxial single crystals, both of which show well aligned dominated signals, as labeled. FIG. 3D illustrate normalized photoluminescence and ultraviolet-visible spectroscopy (UV-vis) absorption spectra for epitaxial single crystals, indicating the high crystalline quality of the epitaxial single crystals. FIG. 3E illustrates high magnification SEM images of surface morphology of a crystal along the <111> direction, showing its textured facets. FIG. 3F illustrates an AFM measurement on the surface of an epitaxial single crystal. The corresponding inset schematic illustrates the source of terraced curve.

These figures show the following. The 0-2θ XRD spectrum shows the epitaxial $MAPbBr_3$ crystals are cubic, space group Pm3m, with a calculated lattice constant of 5.98 Å at room temperature (FIG. 3B). To prove the epitaxial relationship between the as grown single crystal $MAPbBr_3$ and the substrate, 2D-XRD may be employed, as shown in FIG. 3C. The 2D-XRD patterns of both the substrate and the epitaxial crystals exhibit three dominant diffraction peaks, assigned to the (100), (200) and (300) facets of cubic $MAPbBr_3$, demonstrating their high crystallinity. The two sets of peaks from the substrate and epitaxial crystals show perfect alignment to each other, indicating these epitaxial crystals are the same orientation as the substrate. The epitaxial crystals show brighter rings because each epitaxial crystal gives individual diffraction and all of these diffracted signals overlap with each other to form a brighter ring. The absorption spectrum of the epitaxial crystals, starting at around 575 nm, shows a clear band edge cutoff with no excitonic signature (FIG. 3D), indicating a high-quality crystal with a low in-gap defects states. The optical bandgap is calculated to be 2.12 eV. The photoluminescence (PL) peaks at ~550 nm with a~20 nm full width at half maximum, indicating the crystal is high quality. The uniform photoluminescence without any split peaks in epitaxial $MAPbBr_3$ crystals indicates the high crystalline quality of the resulting $MAPbBr_3$ crystals. The narrow PL peak is shorter than the absorption onset, implying the PL emission can be extinguished by $MAPbBr_3$ itself.

Figure 4A:
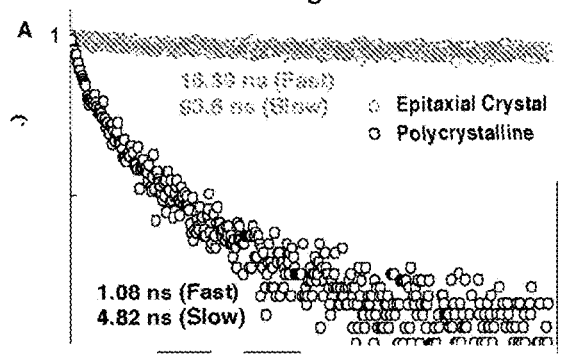
FIGS. 4A-4D illustrate electronic characterization of the controllable organic-inorganic hybrid perovskites.
Figure 12:
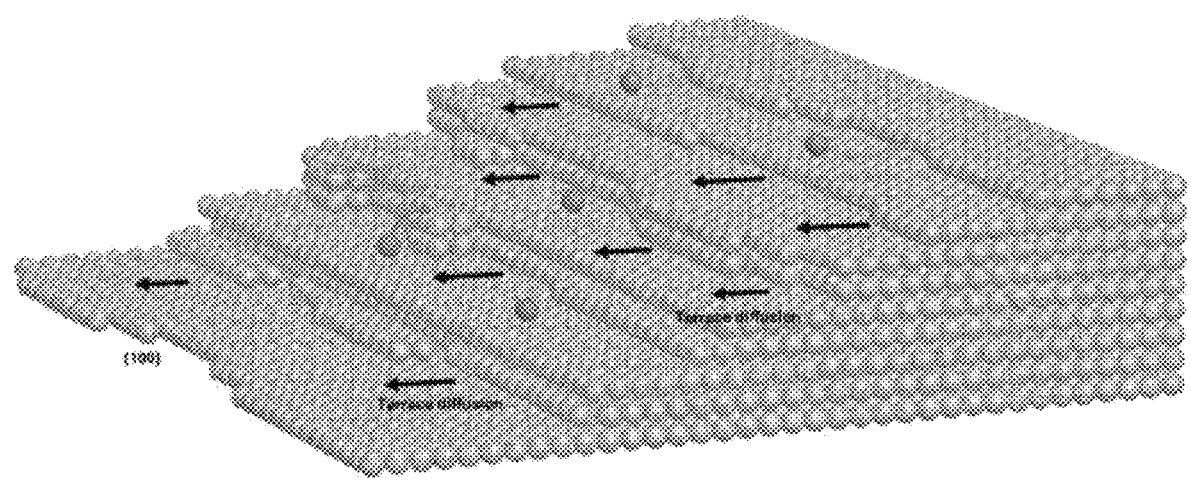
FIG. 12 illustrates a layer-by-layer growth model for the $MAPbBr_3$.

To reveal the growth mechanism of the $MAPbBr_3$ perovskite, the surface morphology of epitaxial single crystals (FIG. 3E) was studied. Epitaxial crystal growing along the <111> direction is used as the example while similar phenomenon is observed along the other directions as well (FIG. 11). The terrace texture is evident on the crystal facets. This growth behavior corresponds to the layer-by-layer growth phenomenon. In this case, dimethylformamide (DMF) solvent has a very high solubility of $MAPbBr_3$. When temperature goes up slightly, there will be large drop in the solubility, which leads to rapid local nucleation of many small crystals rather than a single large crystal, because deposition rate overwhelms diffusion rate. In a room temperature evaporation growth condition, the deposition rate can be controlled to be extraordinary slow, in equilibrium with the diffusion rate. Under this condition, it can be determined that the observed layer-by-layer texture on the crystal facets is a result of the step-flow growth model. Under a fast diffusion rate and a relatively slow deposition rate, interlayer transportation is decreased and terrace diffusion begins to become dominated so that all atoms reach a step edge before nucleation of new islands can occur (FIG. 12). AFM was used to study the surface geometry in high resolution, as shown in FIG. 3F. The surface morphology with the dash-line apparently matches the intrinsic surface roughness of individual layer under step-flow growth model. Also, a step size around 0.6 nm or 1.2 nm exactly corresponds to integral multiples of the single unit-cell height of the MAPbBr$_3$, which can also indicate the layer and layer-by-layer growth. With TRPL, the carrier lifetime T of both epitaxial single crystal and polycrystalline MAPbBr$_3$ could be determined and is shown in FIG. 4A.

FIG. 4 indicates electronic characterization of the samples. FIG. 4A illustrates TRPL spectrum for epitaxial single crystals and polycrystalline one with the same thickness of 5 µm. Both were treated at 40° C. The epitaxial single crystals show much longer lifetime than the polycrystalline. FIG. 4B indicates the carrier lifetime with different growth temperatures for both epitaxial single crystal and polycrystalline. Epitaxial single crystals show an obvious shorter lifetime because of the deformation of the interaction between the organic cations and the surrounding halide anions under increased temperature. The polycrystalline material is relatively insensitive to the treat temperatures. FIG. 4C illustrates a Hall effect measurement for the epitaxial single crystal thin film. The result shows a p-type crystal with higher carrier mobility and lower hole concentration grown at lower temperature. See FIG. 4D, which shows a I-V curve for the trap density measurement of the epitaxial single crystals. The inset picture shows the sample structure and the electrode connection scheme.

In this measurement, epitaxial single crystals were adopted and grew under 40° C. in order to get high quality single crystals. The data from the polycrystalline samples was collected under the same conditions. Results show that epitaxial single crystals have a fast decay T=16.39 ns and a slow decay T=93.60 ns. these two very different time scales were assigned to the presence of a surface component (fast) together with a bulk component (slow), which reveals that carriers can propagate deep in the material. The carrier life in epitaxial single crystals is much longer than that of the polycrystalline MAPbBr$_3$ (a fast decay T=1.08 ns and a slow decay T=4.82 ns). To study the influence of growth rate to crystal quality, epitaxial single crystal MAPbBr$_3$ were grown under different temperatures.

Figure 4B:
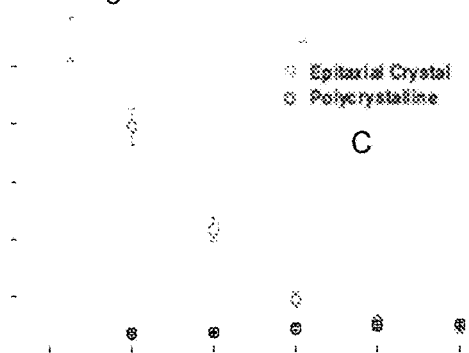
Figure 4C:
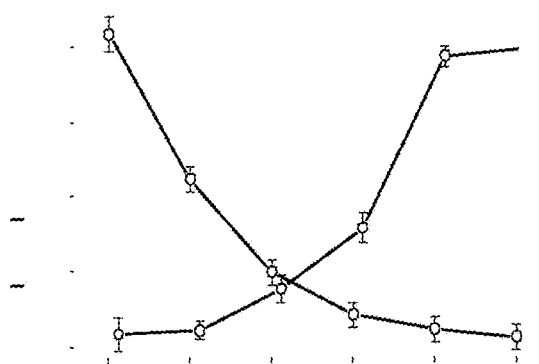
Figure 13:
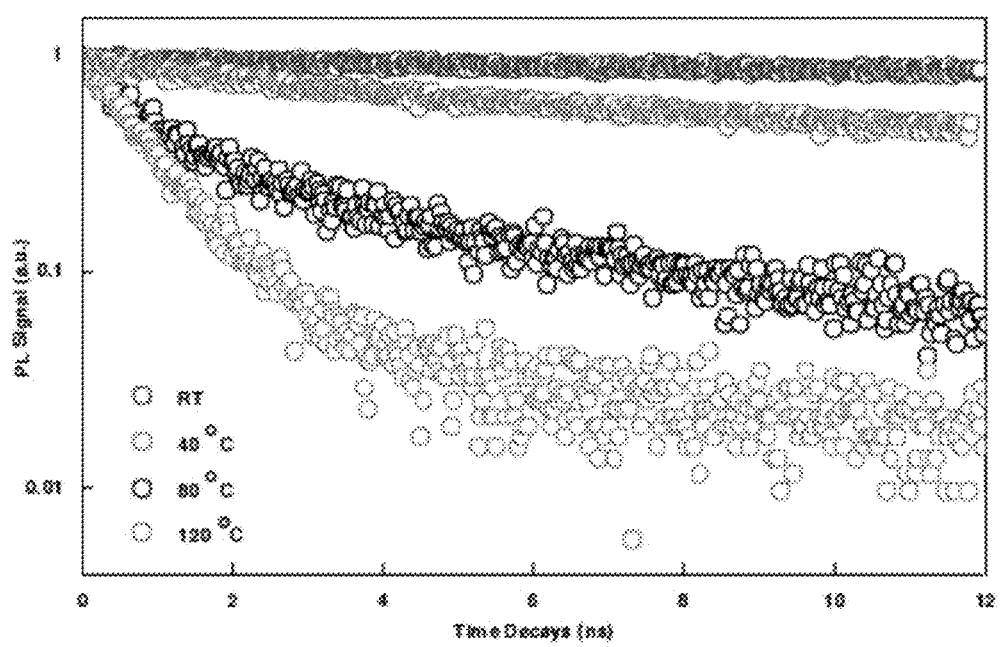
FIG. 13 illustrates a time-resolved photoluminescence (TRPL) measurement for bulk $MAPbBr_3$ crystals.

The results of fast decay (there is almost no slow decay in polycrystalline because of the small grain size under high baking temperature) are plotted in FIG. 4B (bulk crystal in FIG. 13 also shows the same tendency). It was found that the carrier lifetime of the epitaxial single crystal drops significantly with increased growth temperature. When the temperature reached 100° C., carrier lifetimes for epitaxial single crystal perovskite and polycrystalline MAPbBr$_3$ are almost the same. This result was attributed to the deformation of the interaction between the organic cations and the surrounding bromine halide anions under high temperatures, which can introduce a huge amount of nonradiative defects and thus significantly bring down the perovskite quality (FIG. 14) In FIG. 4C, carrier mobility µ of epitaxial single crystal MAPbBr$_3$ grown under different temperatures was studied by the Hall Effect. The MAPbBr$_3$ according to present principles is found to be p-type and the hole concentration increases with increasing growth temperature. Under 40° C., epitaxial single crystal MAPbBr$_3$ exhibits a carrier mobility µ=82 cm$^2$ v$^{-1}$ s$^{-1}$. With the increase of growth temperature, the density of defects in perovskite single crystal increases and yet mobility drops, primarily due to scattering (21).

Figure 4D:
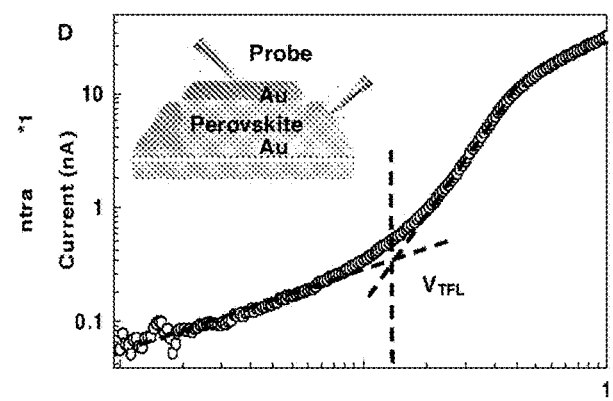

To correlate these parameters with in-gap defect states, the trap density nt was investigated by using space charge limit current (SCLC) method. After growth, a thin layer of gold was deposited (~25 nm) by E-beam evaporation to form a hole-only device. FIG. 4D shows the collected I-V curve measured under dark condition. Three regions can be clearly identified from the plot. At low bias (<0.12 V), the I-V shows linear ohmic response. A trap-filling process is then identified at a bias range from 0.12 V to 0.50 V, and then the trap-filled limit regime starts afterward. By calculation, it was found that the epitaxial single crystal MAPbBr$_3$, with an onset voltage 5V$_{TFL}$=0.12 V, has a trap density n$_t$=5.29× 10$^{10}$ cm$^{-3}$, which is much lower than the polycrystalline thin films. Precise control of epitaxial growth on predefined sites with pre-patterned electrodes allows the fabrication of high-performance functional devices. The fabrication protocol discussed here also applies to polymer-based hole transportation layer that enables us to build an array of LEDs. Details of the fabrication process can be found in the FIG. 9.

FIG. 5 shows the flat band energy-level diagram of the LEDs, and further provides a flat band energy-level diagram of the fabricated LEDs. FIG. 5B illustrates an optical image of a working LEDs under 8.0 V driving voltage, showing a uniform and strong light from individual cubes. FIG. 5C shows a summary of driving voltages needed to light up the epitaxial single crystal LEDs devices. FIG. 5D illustrates a normalized electroluminescence (EL) intensity as a function of the driving voltage, saturating at around 8 V (inset), indicating the recombination region does not shift under different operation condition. FIG. 5E shows current density of a working LEDs under different voltages. The rapidly saturating tendency reveals a minimal leakage current due to the high quality of single crystals. FIG. 5F illustrates external quantum efficiency (EQE), transmission, as well as internal quantum efficiency (IQE) measurements for the epitaxial single crystals LEDs, a highest EQE of 6.1% was achieved at a 9.0 V bias voltage.

In this structure, the MAPbBr$_3$ is the light emitting layer while the poly(2,3-dihydrothieno-1,4-dioxin)-poly(styrene-sulfonate)(PEDOT:PSS) layer serves as the hole, providing an electron-blocking layer simultaneously in virtue of its high ionization energy and low electron affinity. By controlling growth speed, epitaxial single crystal MAPbBr$_3$ dot matrix with 5 µm average height and 20 µm×20 µm square size were obtained.

Figure 16:
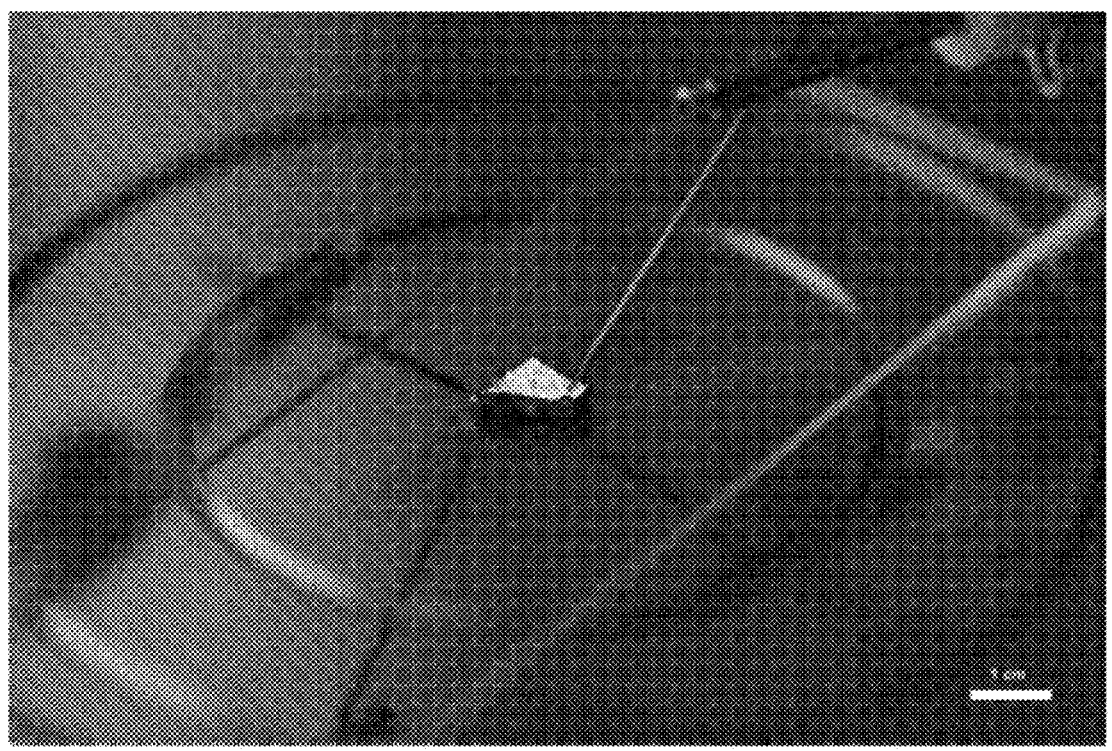
FIG. 16 illustrates a $MAPbBr_3$ epitaxial single crystal array LED under testing.

Although the driving voltage displays some variability, most devices still have a low driving voltage from 2-3 V. A working green LEDs under 8.0 V driving voltage is shown in FIG. 5 and FIG. 16. Its uniform light intensity in each crystal indicated high quality of the crystal. The color of the individual pixel is almost white dues to its high intensity. The EL at different voltages at room temperature is shown in FIG. 5D. The intensity was enhancement with increasing the driving voltage without any shifting in the emission peak, which indicates there is no radiative decay. The dominant emission peak is around 540 nm with a full width at half maximum of about 30 nm. The integrated EL intensity under different voltages demonstrated a saturating tendency from 8 V with an intensity slight decreasing at 9 and 10 V, which may dues to the inevitable heating effect at the high levels of current density. The rapidly saturated current density in FIG. 5E also demonstrated a very efficient carrier injection and transportation in the MAPbBr$_3$ epitaxial single crystals, further indicating that there is minimal leakage current as commonly found in in polycrystalline thin film-based devices. FIG. 5F shows that the highest EQE of 6.1% was achieved at 9.0 V, which is two orders of magnitude higher than the polycrystalline material counterpart. This EQE gives an IQE of 28.2% by dividing the transmission of the top electrode. The increasing EQE in our devices with increased voltage and current density indicated that a high density of charges is required for efficient radiative recombination.

Exemplary Method of Making Devices

Precursor preparation: methylammonium bromide ($CH_3NH_3Br$) was synthesized in a known fashion. To be specific, 15.6 ml of hydrobromic acid (48 wt % in water, Aldrich) was mixed with 20 ml of methylamine (40% in methanol, Tokyo Chemical Industry Co.) in ice-water bath and stirred for 2 hours in a flask. After that, the flask was placed on a hot plate on 50° C. and kept stirring to remove the solvent. The product of $CH_3NH_3Br$ was washed with ethanol by stirring the mixture for 30 min. The precipitate was then centrifuged for three times with diethyl ether and dried under 80° C. overnight. The final $CH_3NH_3Br$ is white powder.

Crystal Preparation:

0.748 g $CH_3NH_3Br$ precursor prepared above was dissolved into 4 mL anhydrous DMF (99.8%, Aldrich) solution in a 20 mL glass vial to form a clear solution. Then, 2.452 g of PbBr (98%, Alfa Aesar) was added into the glass vials with stirring to get a nearly saturated clear $CH_3NH_3PbBr_3$ solution. The glass vial was placed onto a hot plate under 25-35° C. without shaking for evaporation. Large bulk $CH_3NH_3PbBr_3$ single crystals could be formed from the solution after 24 hours.

Mechanical Polishing:

A piece of 1200 grid sand paper was used to polish the large cubic crystal in order to get perovskite substrate with thinner thickness or different facets. During the polishing process, anhydrous 2-propanol (IPA) (99.5%, Aldrich) was used to continuously wash away the grinded perovskite powder, which would otherwise scratch the surface.

In order to obtain different facets, the bulk crystal was precisely fixed in a thick layer of uncured polydimethylsiloxane (PDMS) precursor (Sylgard 184 silicone elastomer, 20:1, Aldrich) with the target orientation facing outside the PDMS, then the mold placed on a hot plate at 70° C. for 10 mins to cure the mold. Then, the mold may be employed with polishing with sand paper and continues anhydrous IPA washing to get the desired different facets exposed.

Lithography:

$CH_3NH_3PbBr_3$ substrate was coated with a layer of Parylene-C (~500 nm in thickness) to form an overall moisture protection layer and strain absorption layer. It was then sputtered with Cr (~50 nm in thickness) and Au (~100 nm in thickness) sequentially to form the adhesion layer and mask/electrode layer. After this, photoresist (AZ-1512) was spin-coated onto the coated $CH_3NH_3PbBr_3$ substrate for photolithography. After that, the Au and Cr were etched sequentially (Au was etched by Au etchant while Cr was etched by reactive ion etching). The residual photoresist was then being washed by acetone (99.5%, Aldrich) followed by Parylene-C dry etching to get the patterned $CH_3NH_3PbBr_3$ substrate.

Solution growth: Patterned $CH_3NH_3PbBr_3$ substrate was placed in an unsaturated $CH_3NH_3PbBr_3$ DMF solution (0.748 g homemade $CH_3NH_3Br$ precursor, 2.452 g PbBr and 5 mL anhydrous DMF) for 30 seconds to remove the polycrystalline structure on the patterned surface caused by O2 plasma etching. The $CH_3NH_3PbBr_3$ substrate was then put into another a room-temperature saturated $CH_3NH_3PbBr_3$ DMF solution with a Teflon scaffold to hold the substrate facing down, to avoid incidental precipitation onto the substrate during heating up, which would otherwise interfere with the normal crystal growth. The vials were placed onto a hot plate to grow the epitaxial perovskite from the patterned openings under different temperatures. Different growth temperatures and different sizes of the patterned openings result in different morphologies of the epitaxial perovskite crystals: high temperature (>80° C.) with small holes (<5 μm) can result in a rod-like structure; low temperature (<60° C.) with large holes (>10 μm) can result in a plate-like structure; low temperature (<60° C.) and medial holes (5-10 μm) can result in a cubic-like structure. Growth in different orientations, such as in <110> and <111>, also obey the same tendency.

Device Fabrication:

Polished $CH_3NH_3PbBr_3$ substrate was coated with a layer of Parylene-C (~500 nm in thickness) followed by sputtered layers of Cr (~50 nm in thickness) and Au (~100 nm in thickness). 0.5 mL PEDOT:PSS (Aldrich) was mixed with 10 mL anhydrous IPA, and the mixture was treated under ultrasound for 30 mins to ensure homogeneous dissolution. After this, a layer of PEDOT:PSS (~200 nm in thickness) was deposited onto the Au layer using a spray gun under baking on a hot plate at 80° C. to evaporate the solvent simultaneously. Then, the substrate was sequentially deposited by layers of Parylene-C, poly(methacrylic acid methyl ester) (PMMA), and $SiO_2$ on top of the PEDOT:PSS. Because these layers only assist the pattern of PEDOT:PSS, the thickness actually does not affect the fabrication process. Specially, the Parylen-C layer on the PEDOT:PSS helps to fix the PEDOT:PSS layer during the Au wet etching process to avoid the loss of PEDOT:PSS; Spin coated PMMA helps to increase the adhesion between Parylene-C layer and the $SiO_2$ layer; $SiO_2$ layer acts as a top pattern layer and an etching stop layer. After this, photoresist was spin coated onto the $SiO_2$ layer to perform photolithography. In the etching process, $SiO_2$, Parylene-C, PMMA, PEDOT:PSS, and Cr were removed by dry etching; Au was removed by wet etching. Then the perovskite/Parylene-C/Cr/Au/PEDOT:PSS structure was obtained.

Based on this structure, epitaxial perovskite single crystals were grown from solution and in one example were employed in the fabrication of LEDs. After growing the epitaxial crystal arrays (~5 μm in thickness), PMMA and AZ-1525 was spin-coated on the epitaxial single crystal array to form the isolation layer. Slight etching of the isolation layer would expose the top portion of the epitaxial crystal array, while the bottom portion and the bottom substrate were insulated by the PMMA layer. A layer of indium tin oxide (ITO) (~200 nm in thickness) was deposited to form the top electrode of the final LEDs (FIGS. 15A-15F). The EL, current density, EQE of the LEDs were further tested to characterize their properties.

Material characterization: SEM images were acquired using a Zeiss Sigma 500 scanning electron microscope. The photoluminescent (PL) spectrum and TRPL of epitaxial perovskite crystals were measured by a Microscope Olympus IX81 with a Mai Tai HP laser in a black box at room temperature. Powder XRD and single crystal 2D XRD were measured using a state-of-the-art Bruker Single-Crystal diffractometer and a state-of-the-art Bruker Bulk diffractometer with Cu K(alpha), with wavelength of 1.5406 A radiation, respectively. $CH_3NH_3PbBr_3$ powders were made by grinding a larger crystal into fine powders in a mortar. EDX mapping was preformed through the ESEM field emission environmental scanning electron microscope (PEI/Phillips XL30 ESEM). Absorption and transmittance spectra were collected with a Perkin Elmer Lambda 1050 UV-Vis spectrophotometer with an internally coupled integrating sphere. In order to measure the absorption spectra from the epitaxial single crystal, the epitaxial single crystal thin film was grown and peeled off from the bulk perovskite substrate to do the measurement. For the crystal surface investigation, the morphology of the perovskite epitaxial crystals was determined using an AFM measurement (Veeco Scanning Probe Microscope) under tapping mode.

AFM measurement was repeated with different growth conditions to avoid the influence of the concentration gradient; however, all results showed the same phenomenon. Trap density was characterized and calculated through reported I-V SCLC method with a home-built probe station system that could include a black box and a Keithley 2400 source meter under dark environment at room temperature. The top and bottom Au layers were deposited by e-beam evaporation. Hall effect was measured using a Lake Shore Hall measurement system HM 3000 with the four contacts van der Pauw method. In order to use e-beam evaporation to deposit four Au contacts onto epitaxial crystals, Parylene-C served as the only pattern mask (to avoid the metal influence) to grow the continuous epitaxial single crystal thin film.

All samples were measured at room temperature.

Device Characterization:

All LEDs devices were connected through two Cu wires to external equipment for characterization. EL characteristics were measured using a Keithley 2400 source meter with an Ocean Optics QE65 Pro TE-cooled CCD spectrophotometer under a dark environment. Current density measurement was performed with the same setup with a trap density measurement under the same dark room temperature condition. The EQE of the device was measured using a home-built measurement system, which includes a source meter, an integration sphere and an optical power meter (1936-R, Newport). All the optical images were taken by a Zeiss Axio Imager Optical Microscope.

FIGS. 6A-6D and 7A-7D provide schematics and optical images of the growth process. FIGS. 6A-6D is a schematic illustration of the growth process, where each step and key component is labeled. In FIG. 6A, the Parylene-C/Cr/Au layers may be seen atop the perovskite. In FIG. 6B, lithography and etching are shown to expose certain layers, including in some cases the perovskite. In some cases, the polycrystalline layer may be in part removed (FIG. 6C). Finally, in FIG. 6D, epitaxial growth may occur on the remaining layers as exposed.

FIGS. 7A-7D provide optical images of the actual materials. The perovskite substrates (7A) are firstly mechanically polished and coated with Parylene-C (7B), then coated with thin layers of Cr and Au (7C), then patterned by photolithography (7D), then etched by combined wet and dry etchants (7E), and finally immersed in solution for epitaxial growth (7F).

Figures 8A, 8B:
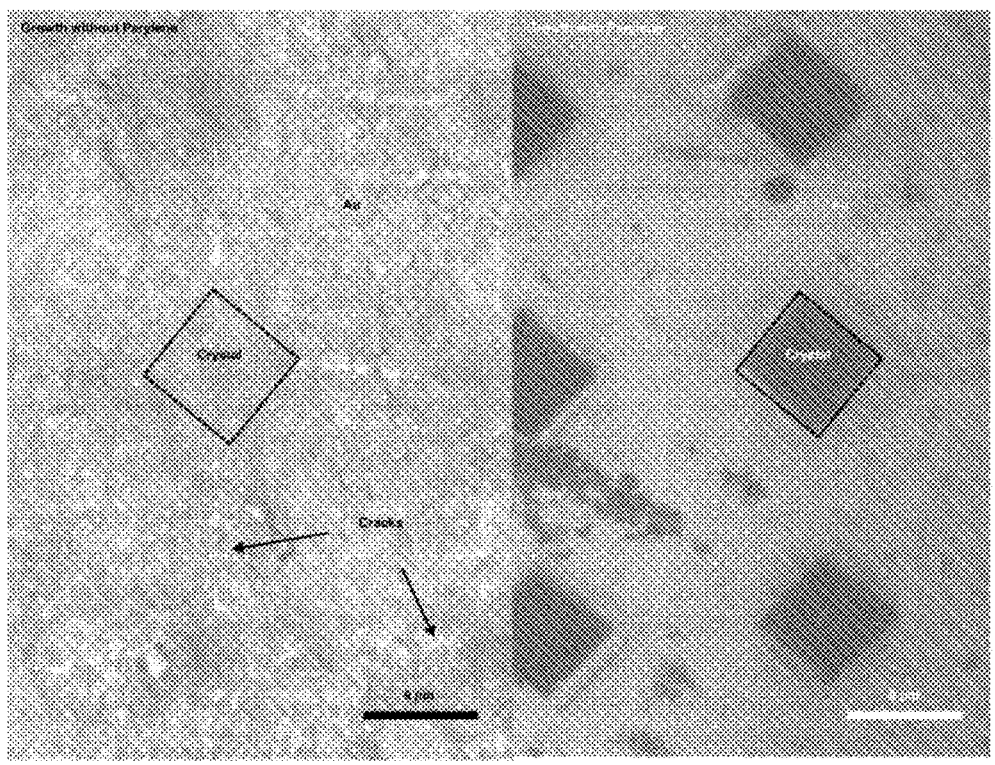
FIGS. 8A and 8B illustrate the use of Parylene-C as a moisture barrier and strain absorption layer.

FIGS. 8A and 8B illustrate Parylene-C as a moisture barrier and strain absorption layer. Optical images of perovskite substrate surface after epitaxial growth without (8A) and with (8B) Parylene-C. Cracks appear on both Cr and Au layers without the Parylene-C layer, which will destroy the pattern during the photolithography and epitaxial growth processes.

FIGS. 9A and 9B illustrate how a fresh saturated MAPbBr$_3$ solution may be advantageously employed for the uniform epitaxial single crystal arrays growth. FIG. 9A shows perovskite single crystal cubes with uniform sizes and facets as may be obtained when using a fresh nutrient solution. FIG. 9B illustrates how a perovskite with irregular shapes appears using a recycled nutrient solution to grow the epitaxial single crystals with the other growth conditions the same. The recycled solution may have some impurity ions or ligands, which could help stabilize the {110} surfaces.

A "fresh" solution is the initial saturated solution just prepared with the precursor and lead salt, and this solution generally has not been used in any growth process. A "recycled" solution is one that has been used in several growth processes, e.g., 3, 4, or 5. After the growth process, the as-prepared fresh saturated solution will become unsaturated. Adding additional precursor and lead salt into the solution can make it saturated again, which is then termed a "recycled solution". The composition and the concentration of the recycled solution are the same as the fresh solution. However, different growth results can be yielded by using the recycled solution and fresh solution. This may be due to different reactivity of the solution caused by the recycling process.

FIG. 10 shows EDX spectroscopy of a MAPbBr$_3$ epitaxial cube. A randomly selected MAPbBr$_3$ epitaxial single crystal cube was used to perform the EDX analysis. Pb, Br, and N elements can be detected with expected atomic ratios.

FIGS. 11A-11D illustrate AFM scan profiles of representative MAPbBr$_3$ epitaxial cubes with different growth directions, revealing the layer-by-layer growth mechanism. FIG. 11A shows an AFM measurement of the epitaxial crystal growing along<110> and FIG. 11B shows an SEM image showing the corresponding crystal surface. The average roughness of the zig-zag curve reflects the intrinsic roughness of the MAPbBr$_3$, which result from the lattice parameter. The step size between adjacent layers shows integer multiples of the unit cell size, which demonstrates the layer-by-layer growth mechanism. FIG. 11B shows an AFM measurement of the epitaxial crystal growing along<001> direction and FIG. 11D shows the corresponding SEM image showing the crystal surface.

FIG. 12 illustrates schematically a layer-by-layer growth model for the MAPbBr$_3$. Under fast terrace diffusion rates and relatively slow interlayer transportation rates, the adatoms tend to grow a single layer rather than form a multilayer or an island structure.

FIG. 13 illustrates a TRPL measurement for bulk MAPbBr$_3$ crystals. Bulk MAPbBr$_3$ single crystals under different growth temperature were used to perform TRPL measurement. The results show the same tendency as epitaxial single crystals, which further proves that higher growth temperature will lower the crystal lifetime. The same batch of crystal seeds and solutions were used to grow larger crystals under different temperature for testing. The growth time was controlled to be the same.

Figure 14:
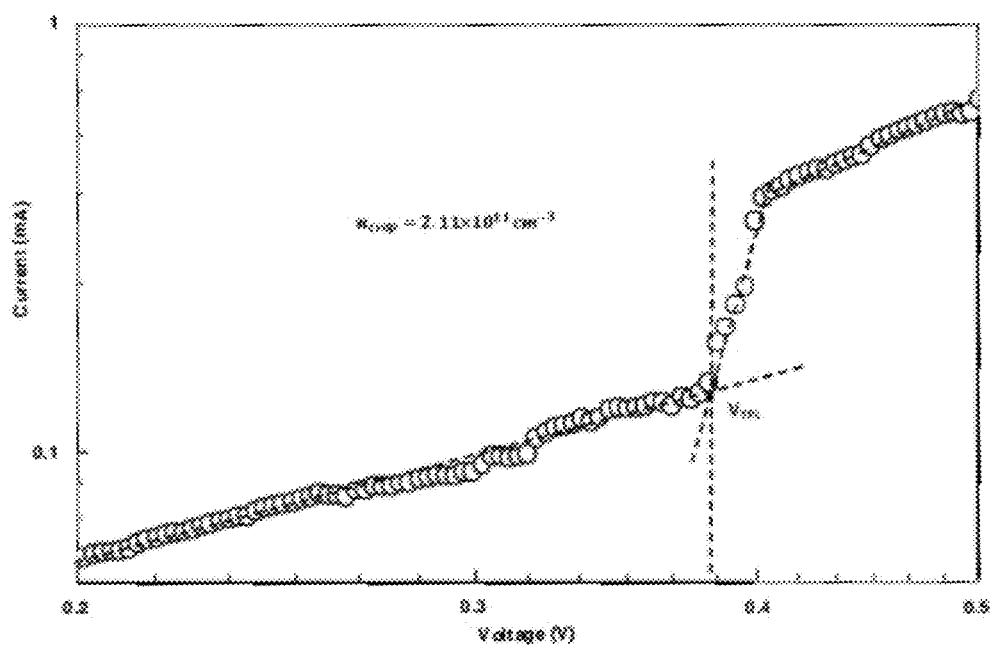
FIG. 14 illustrates an IV curve for trap density measurement with $MAPbBr_3$ epitaxial single crystal grown at 80° C.
Figure 15A:
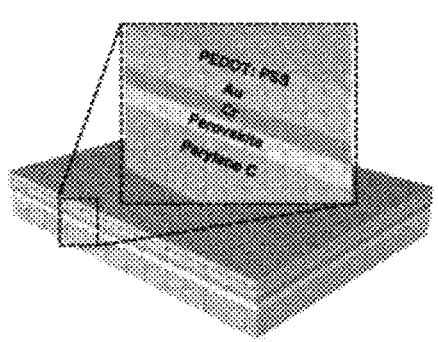
FIGS. 15A-15F illustrates schematics for the fabrication of organic-inorganic hybrid perovskite epitaxial single crystal LEDs.
Figure 15B:
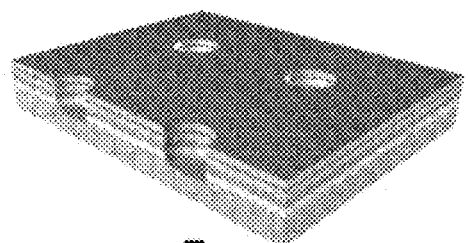
Figure 15D:
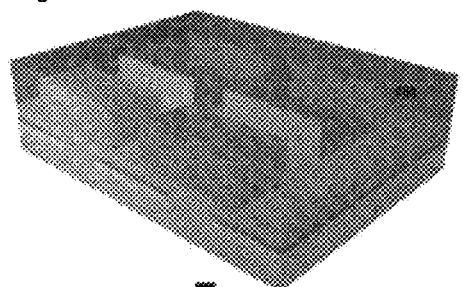
Figure 15C:
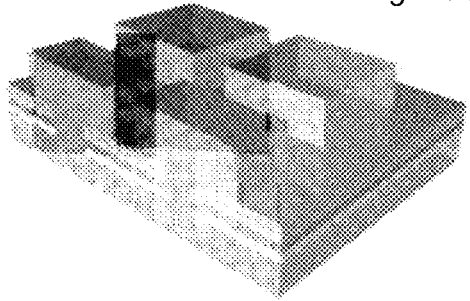
Figure 15E:
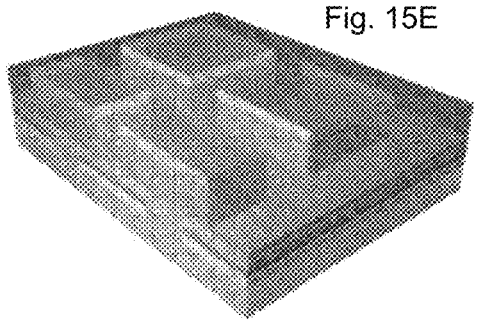
Figure 15F:
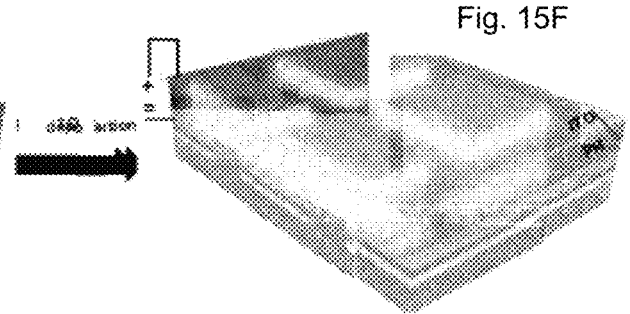

FIG. 14 illustrates an IV curve for trap density measurement with a MAPbBr$_3$ epitaxial single crystal grown at 80° C. The calculated trap density of the MAPbBr$_3$ epitaxial single crystal under 80° C. is one order of magnitude higher than that of 40° C., which indicates a higher defect level with increased growth temperature.

FIGS. 15A-15F illustrate schematics for the fabrication of organic-inorganic hybrid perovskite epitaxial single crystal LEDs. An ITO/MAPbBr$_3$/PEDOT:PSS/Au device structure is used. Here PEDOT:PSS is used as a hole transporting layer while the Au and ITO play as the two electrodes. The PR is used as the isolation layer to avoid the short contact between ITO and Au.

FIG. 16 illustrates a MAPbBr$_3$ epitaxial single crystal array LED under testing. The driving voltage was around 2 V, and the light intensity increases with increased applied voltage.

While the invention herein disclosed is capable of obtaining the objects hereinbefore stated, it is to be understood that this disclosure is merely illustrative of the presently preferred embodiments of the invention and that no limitations are intended other than as described in the appended claims. For example, the invention can be used in a wide variety of settings, e.g., besides the applications of LEDs.

The invention claimed is:

1. A method of preparing a heterostructure, comprising:
providing a substrate layer, the substrate layer including an inorganic/organic hybrid perovskite;
depositing on the substrate layer, a protective layer, the protective layer constituted of a material impervious to air, oxygen, water, and moisture;
depositing on the protective layer an adhesion layer, the adhesion layer including an element selected from the group consisting of Cr, Ni, Ti, or elements with similar adhesive properties;
depositing on the adhesion layer an electrode layer, the electrode layer including an element selected from the group consisting of Ag, Al, Au, Cu, or elements with similar electrical properties; and
performing patterning and lithography.

2. The method of claim 1, wherein the substrate layer is a bulk crystal of MAPbBr3.

3. The method of claim 1, wherein the protective layer is a hermetic material.

4. The method of claim 3, wherein the hermetic material is Parylene-C, polyimide, epoxy, or another material that is a polymer and that is airtight, oxygen-tight, and water-tight, and which can be deposited as a thin film, or a combination of these.

5. The method of claim 1, wherein the protective layer is deposited by a step of vacuum phase physical vapor deposition (PVD), thermal evaporation, or other evaporation or sublimation processes.

6. The method of claim 1, wherein the adhesion layer is deposited by a step of sputtering or other physical or chemical deposition technique.

7. The method of claim 1, wherein the electrode layer is deposited by a step of sputtering or other physical or chemical deposition technique.

8. The method of claim 1, wherein the patterning and lithography include a step of dry etching.

9. The method of claim 8, further comprising epitaxially growing single crystalline hybrid perovskite crystals on top of the substrate layer subsequent to the dry etching step.

10. The method of claim 9, wherein the epitaxially growing step is performed by an inverse temperature method.

11. The method of claim 8, wherein the dry etching step includes a step of gas phase plasma etching.

12. The method of claim 8, further comprising controlling crystal morphology of the epitaxially grown single crystalline hybrid perovskite crystals by controlling crystal distribution, growth temperature, or growth time.

13. The method of claim 8, further comprising controlling crystal orientation of the epitaxially grown single crystalline hybrid perovskite crystals by controlling substrate orientation.

14. The method of claim 1, wherein the protective layer is further configured to provide a degree of strain relief.

15. A heterostructure device, comprising:
a substrate layer, the substrate layer including a bulk crystal of an inorganic/organic hybrid perovskite;
a protective layer above the substrate layer, the protective layer constituted of a material impervious to air, oxygen, water, and moisture;
an adhesion layer above the protective layer, the adhesion layer including an element selected from the group consisting of Cr, Ni, Ti, or elements with similar adhesive properties;
an electrode layer above the adhesion layer, the electrode layer including an element selected from the group consisting of Ag, Al, Au, Cu, or elements with similar electrical properties;
wherein at least a portion of the protective layer, adhesion layer, and electrode layer are patterned and photolithographed to expose at least a portion of the substrate layer; and
an epitaxially-grown single crystalline perovskite layer above at least the exposed portion.

16. The heterostructure device of claim 15, wherein the device forms part of an LED.

17. The heterostructure device of claim 15, wherein the protective layer is a hermetic material.

18. The heterostructure device of claim 17, wherein the hermetic material is Parylene-C, polyimide, epoxy, or another material that is a polymer and that is airtight, oxygen-tight, and water-tight, and which can be deposited as a thin film, or a combination of these.

19. A device made by the method of claim 1.

* * * * *